United States Patent [19]
Coca et al.

[11] Patent Number: 6,143,414
[45] Date of Patent: Nov. 7, 2000

[54] COMPOUND LAMINATE FOR PRINTED CIRCUIT BOARDS

[76] Inventors: Felip Balsells Coca, Alt de Pedrell, 47-49; Antonio Rodriguez Siurana, Portola, 10, both of 08032 Barcelona, Spain

[21] Appl. No.: 09/150,791

[22] Filed: Sep. 10, 1998

[30] Foreign Application Priority Data

Sep. 10, 1997 [ES] Spain ............................... 9701912

[51] Int. Cl.$^7$ ................................................. B32B 27/38
[52] U.S. Cl. ........................ 428/413; 428/415; 428/416; 428/426; 442/241; 442/255
[58] Field of Search ............................. 428/190, 404, 428/415, 426, 209, 220, 416, 413, 432; 442/241, 255

[56] References Cited

U.S. PATENT DOCUMENTS 3,393,117  7/1968  Zolg et al. ............................. 161/82
3,617,613  11/1971  Benzinger et al. .................... 174/68.5

*Primary Examiner*—Bruce H. Hess
*Assistant Examiner*—Michael Grendzynski
*Attorney, Agent, or Firm*—Steinberg & Raskin, P.C.

[57] ABSTRACT

It includes two outer sheets of continuous-strand fiberglass fabric and a core of non-woven fiberglass formed by sheets of fiberglass paper, all sheets being impregnated with epoxy resin, and presenting at least one sheet of conducting material, on one or both outer sides; it is characterized in that it incorporates in the non-woven fiberglass core at least one intermediate sheet of fiberglass fabric impregnated with resin.

It allows manufacturing of reliable printed circuits, even when using surface-mounted components, while at the same time its cost is relatively low; it is particularly suitable for the field of consumer and semi-professional electronics.

7 Claims, 1 Drawing Sheet

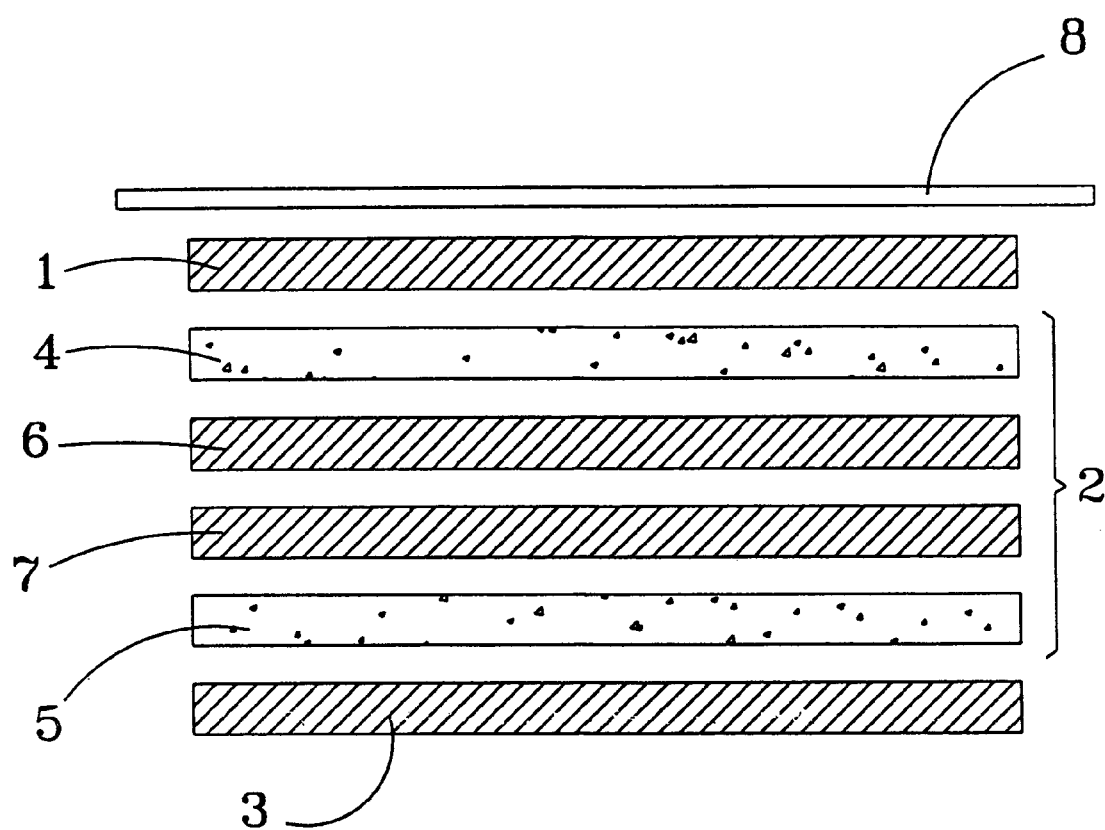
FIGURE

COMPOUND LAMINATE FOR PRINTED CIRCUIT BOARDS

The present invention relates to a compound laminate for printed circuit boards, of the type which includes layers of fibreglass fabric and fibreglass paper impregnated with resin, and sheets of conducting material on one or both outer sides.

BACKGROUND OF THE INVENTION

Printed circuit boards are manufactured from a sheaf of sheets of fibreglass fabric, fibreglass paper or the like, impregnated with a resin, such as epoxy, phenolic or polyester resin, etc. One or both outer sides of this sheaf incorporate one or two sheets of copper, which will serve to form the tracks of the printed circuit.

Once formed, the sheaf is subjected to heat and pressure in order to cure the resin and obtain a compound laminate, from which the boards for printed circuits are cut to the desired size.

Various compound laminates exist, and the materials of the base sheets and the resins used for impregnating the base sheets can be varied, depending on the application they are to be used for. The present invention relates more particularly to compound laminates made up of sheets of fibreglass fabric and sheets of fibreglass paper impregnated with epoxy resins.

Two of these compound materials widely used are described for example in US standard NEMA LI-1, and are known in this field of the art under the designations "CEM-3" and "FR-4".

CEM-3 is a compound laminate which includes two outer sheets of continuous-strand fibreglass fabric and a core of non-woven fibreglass (made up of sheets of fibreglass paper), all the sheets being impregnated with epoxy resin; this is the closest prior art to the present invention, and it serves as a basis for the preamble of claim 1.

FR-4 is a compound laminate made up only of sheets of fibreglass fabric impregnated with an epoxy resin.

FR-4 is a material with good thermal stability (the dilation due to an increase in temperature is low), but fibreglass fabric has a high cost and, moreover, the laminate is difficult to die-cut because of its hardness. As a consequence, this material is expensive and is normally reserved for the field of professional electronics.

CEM-3 is lower in cost and is easier to die-cut; it nevertheless presents some characteristics which may be critical for some applications. In the first place, its dimensional stability under thermal stresses is lower than that of FR-4, and in some cases thermal dilation of the board can lead to breakage of the soldered points. This phenomenon arises particularly when using surface-mounting ceramic components and integrated circuits, known as "SMD" (surface mounting device), especially where such devices are of considerable length.

In consequence, where SMD ceramic components of large size must be incorporated into the circuit, there may be a need to use FR-4 boards, thereby making the printed circuits more expensive. It would be desirable to avoid such increased cost, especially in consumer and semi-professional electronics, fields in which increasing numbers of SMDs are being used.

Another disadvantage of CEM-3 is that it is more fragile in the process of grooving the working panels in individual circuits, by means of the "scoring" technique, since the formed groove can totally eliminate the layer of fibreglass, so that the impregnated paper left is not strong enough to prevent undesired breakage of the panel.

DESCRIPTION OF THE INVENTION

The main objective of the present invention is to provide a compound laminate for printed circuit boards which allows manufacturing of printed circuits that are reliable even when surface mounting devices are used, while at the same time are of relatively low cost; this material is particularly suitable for application in the field of consumer and semi-professional electronics.

In accordance with these objectives, the compound laminate is characterized in that it incorporates in its non-woven fibreglass core at least one intermediate sheet of fibreglass fabric impregnated with resin.

This new laminate has many advantages. Firstly, the intermediate fibreglass fabric sheet allows a remarkable improvement in the thermal dimensional stability characteristics when compared with CEM-3 (the new material withstands the thermal resistance tests, in which it is submitted to cycles of extreme temperatures, much better than the CEM-3), while at the same time it costs less than FR-4. Indeed, it has been found that it can be used for boards which incorporate surface mounting devices (SMDs) without risk of breakage of the soldered points.

Furthermore, printed circuit boards manufactured with this material can be subjected to "scoring" without giving rise to resistance problems, because the intermediate sheets of fibreglass fabric hold the board together even if a groove is made in the outer sheets.

Advantageously, said intermediate sheet of fibreglass fabric is impregnated with epoxy resin.

In accordance with a preferred embodiment of the invention, the non-woven fibreglass core has at least two intermediate sheets of fibreglass fabric impregnated with resin, and preferably, the fibres of at least one of said sheets are oriented in a direction at right angles to the fibres of at least one of the outer sheets.

The incorporation of several sheets of fibreglass fabric, with their fibres crossed, increases the dimensional stability in all directions of the board.

According to one structural feature, said intermediate sheets of fibreglass fabric are placed substantially in a central region of the core.

BRIEF DESCRIPTION OF THE DRAWINGS

For a better understanding of all that has been outlined, some drawings are attached which, schematically and solely by way of non-restrictive example, show a practical case of embodiment.

In said drawings, the single FIGURE thereof shows in section a sheaf of sheets prepared for manufacturing the compound laminate in accordance with a preferred embodiment of the present invention.

DESCRIPTION OF A PREFERRED EMBODIMENT

The compound laminate of the invention is made up, in the example shown in the FIGURE, of a sheaf which comprises a first outer sheet 1 of fibreglass fabric, a core 2 and a second outer sheet 3 of fibreglass fabric.

The core 2 includes several sheets of fibreglass paper, numbering two in the example shown and marked with reference numbers 4 and 5, and in the central region of the core are housed a first 6 and a second 7 intermediate sheet of fibreglass fabric. All the sheets of fibreglass fabric and fibreglass paper are impregnated with epoxy resin, as described below.

The intermediate sheets 6,7 of fibreglass fabric are arranged in the sheaf with their fibres oriented in two directions at right angles to each other, in order to achieve a reduction of the thermal expansion coefficient in both directions x,y of the manufactured printed circuit board.

Incorporated on one of the exposed sides of the sheaf is a sheet of copper 8, which is used to form the printed circuit as such.

This laminate is manufactured as follows.

Fibreglass paper weighing between 50 and 100 g/m$^2$, preferably 75 g/m$^2$, is impregnated by immersion in a varnish composed of epoxy resin, mineral fillers, hardener, catalyst and suitable solvents. Following regulation of the amount of varnish absorbed using dispensing cylinders, the solvent is evaporated in a hot-air tunnel and the dry strip obtained, called preimpregnated ("prepreg"), is cut into sheets; the resulting sheets have a weight between 400 and 800 g/m$^2$, preferably 650 g/m$^2$.

Examples of suitable epoxy resins are, amongst others, those marketed under the designations Epikote 220, Epikote 1143, Araldite 8014, D.E.R. 537. The most widely used hardener is dicyandiamide. Benzyl-dimethyl-amine, alkyl imidazoles, aryl imidazoles, etc., can be used as catalysts. Calcium carbonate, magnesium-calcium carbonate, aluminium silicate, aluminium hydroxide, silicon oxide, etc., can be used as mineral fillers.

Likewise, continuous fibreglass fabric of between 100 and 240 g/m$^2$, preferably 200 g/m$^2$, is impregnated until a dry prepreg of between 200 and 400 g/m$^2$, preferably 360 g/m$^2$, is obtained, and this is also cut into sheets.

These sheets are then used to make up the sheaf shown in the FIGURE, and the sheaf is submitted to a process which includes the application of heat and pressure in order to harden it and form a printed circuit board.

The thermal expansion coefficients along the x,y axes of the laminate obtained, beneath the temperature of vitreous transition (approx. 116° C.) at which the material passes from a rigid response to a deformable response, are between $18 \times 10^{-6}$ and $20 \times 10^{-6}$ mm/° K for the x axis, and between $19 \times 10^{-6}$ and $21 \times 10^{-6}$ mm/° K for the y axis.

A description follows of the results obtained in a number of tests carried out on samples of the laminate of the invention and samples of the known materials, in order to reveal more clearly the advantages of the invention.

In the examples presented below, the impregnation was carried out using varnishes of the following compositions (parts by weight):

|  | Varnish 1 | Varnish 2 |
| --- | --- | --- |
| Araldite 8014 | 100 | 100 |
| Dicyandiamide | 3 | 3 |
| 2-methyl-imidazole | 0,10 | 0,10 |
| Aluminium silicate | 77 | — |
| Mono methyl glycol | 87 | 27 |
| Methyl ethyl ketone | 33 | 33 |

Fibreglass paper of 75 g/m$^2$ was impregnated with Varnish 1 and, once the solvents had evaporated, gave a prepreg weighing 650 g/m$^2$, shown below as IGP (impregnated fibreglass paper).

Similarly, fibreglass fabric of 203 g/m$^2$ was impregnated with Varnish 2 and, once the solvents had evaporated, gave a prepreg weighing 365 g/m$^2$, shown below as IGT (impregnated fibreglass fabric).

These prepregs, together with electrodeposited copper sheet of 296 g/m$^2$ (35 micrometers) were used to make the following laminates:

| laminate A: | 1 sheet copper |
| --- | --- |
|  | 8 sheets IGT |
| laminate B: | 1 sheet copper |
|  | 1 sheet IGT |
|  | 3 sheets IGP |
|  | 1 sheet IGT |
| laminate C: | 1 sheet copper |
|  | 1 sheet IGT |
|  | 1 sheet IGP |
|  | 2 sheets IGT, crossed |
|  | 1 sheet IGP |
|  | 1 sheet IGT |

Laminate A is a material of type FR-4 according to standard CEI 249-2-5, and laminate B is a material of type CEM-3 according to standard CEI-249-2-10, while laminate C constitutes an embodiment of the laminate of the invention, as shown in the FIGURE.

These laminates were consolidated between steel boards under a specific pressure of 35 bar and a temperature cycle of 60 minutes at 150° C.

The characteristics of the three laminates obtained were tested in accordance with standard CEI-249-1, with the following results:

|  | A | B | C |
| --- | --- | --- | --- |
| Vert. Flame Resist. (sec) | 21/5 | 32/7 | 28/7 |
| Classification | FV-0 | FV-0 | FV-0 |
| Flexion Resist. (N/cm$^2$) | 44000 | 30000 | 30000 |
| Vitreous transition temp. (° C.) | 118 | 116 | 116 |
| Thermal Expansion Coefficient between 35 y 90° C. (ppm/° C.) |  |  |  |
| z axis | 40 | 38 | 38 |
| x axis | 14 | 26 | 19 |
| y axis | 17 | 30 | 20 |
| Temp. Resistance (260° C.) (sec) | >180 | >180 | >180 |
| Thermal Conductivity at 60° C. (W/° Km) | 0,36 | 0,65 | 0,52 |

As can be seen, the thermal expansion of the new material is substantially lower than that of CEM-3, being close to that of FR-4 for the y axis, despite the fact that it has only half the number of fibreglass fabric sheets as FR-4, and therefore a much lower cost.

Although specific embodiments of the laminate of the invention have been described and shown, it will be understood that this material can be varied and modified, for example with respect to the number of sheets of each type and their geometrical dimensions, which must be considered to be included within the sphere of protection defined by the attached Claims.

Indeed, according to the specific requirements of the application to which the material is destined, there can be variations, for example, in the number of sheets of fibreglass paper and sheets of fibreglass fabric included in the core, and variations in their position within that core.

What is claimed is:

1. A compound laminate for printed circuit boards, comprising a plurality of sheets in the following order:
- a first outer sheet of continuous-strand fiberglass fabric impregnated with epoxy resin,
- at least one sheet of fiberglass paper impregnated with epoxy resin,
- at least one intermediate sheet of fiberglass fabric impregnated with resin,
- at least one sheet of fiberglass paper impregnated with epoxy resin,
- a second outer sheet of continuous-strand fiberglass fabric impregnated with epoxy resin, and
- a sheet of conducting material.

2. The compound laminate as in claim 1, wherein said at least one intermediate sheet of fiberglass fabric comprises two intermediate sheets of fiberglass fabric.

3. The compound laminate as in claim 1, wherein said at least one intermediate sheet of fiberglass fabric is arranged in the center of said core such that there exists the same number of sheets of fiberglass paper on each side of said intermediate sheet.

4. The compound laminate as in claim 1, wherein said at least one intermediate sheet of fiberglass fabric is impregnated with epoxy resin.

5. The compound laminate as in claim 1, wherein the fibers of one of said intermediate sheets of fiberglass fabric are orientated in a direction perpendicular to the fibers of the other one of said intermediate sheets of fiberglass fabric.

6. The compound laminate as in claim 1, wherein said sheet of conducting material is arranged on an outer side of one of said first and second outer sheets of continuous-strand fiberglass fabric.

7. The compound laminate as in claim 1, wherein said sheet of conducting material is arranged on an outer side of one of said first and second outer sheets of continuous-strand fiberglass material and a second sheet of conducting material is arranged on an outer side the other one of said first and second sheets of continuous-strand fiberglass fabric.

* * * * *